(12) United States Patent
Powers

(10) Patent No.: US 7,589,946 B2
(45) Date of Patent: Sep. 15, 2009

(54) LOCAL ACCESS PORT COMMUNICATIONS USING NEAR FIELD INDUCTION

(75) Inventor: Randall L. Powers, Raleigh, NC (US)

(73) Assignee: ADC DSL Systems, Inc., Eden Prarie, MN (US)

( * ) Notice: Subject to any disclaimer, the term of this patent is extended or adjusted under 35 U.S.C. 154(b) by 663 days.

(21) Appl. No.: 11/354,500

(22) Filed: Feb. 15, 2006

(65) Prior Publication Data

US 2007/0188317 A1    Aug. 16, 2007

(51) Int. Cl.
*H02H 3/22* (2006.01)
(52) U.S. Cl. ............................ 361/111; 361/58; 361/71; 361/91; 361/112
(58) Field of Classification Search .................... 361/56, 361/111, 235, 58, 112
See application file for complete search history.

(56) References Cited

U.S. PATENT DOCUMENTS

| | | | | |
|---|---|---|---|---|
| 4,087,782 A | * | 5/1978 | Oishi et al. ............... | 180/271 |
| 4,803,485 A | * | 2/1989 | Rypinski ................... | 370/452 |
| 5,444,856 A | * | 8/1995 | Bowers et al. ............ | 709/221 |
| 5,995,353 A | * | 11/1999 | Cunningham et al. ..... | 361/111 |
| 6,456,088 B1 | * | 9/2002 | Swale ....................... | 324/525 |
| 7,148,799 B2 | * | 12/2006 | Cern et al. ............. | 340/538.16 |
| 7,372,688 B2 | * | 5/2008 | Harris ....................... | 361/119 |
| 2007/0165345 A1 | * | 7/2007 | Woo .......................... | 361/56 |
| 2007/0189495 A1 | * | 8/2007 | Crawley et al. ........... | 379/323 |
| 2008/0062600 A1 | * | 3/2008 | Crawley et al. ........... | 361/56 |
| 2008/0156055 A1 | * | 7/2008 | Delwaulle ................. | 72/38 |

* cited by examiner

*Primary Examiner*—Linh V Nguyen
(74) *Attorney, Agent, or Firm*—Fogg & Powers LLC

(57) ABSTRACT

A method for accessing an electronic circuit in an enclosure using near field induction is disclosed. The method involves attaching at least one local access port connector with an external transformer core partition to a near field induction port on an external non-conductive surface of a panel of the enclosure and generating at least one inductive field between the external transformer core partition and an internal transformer core partition. Without a direct electrical connection, the method provides for communicating with the electronic circuit through the at least one local access port connector of the panel using the at least one inductive field.

21 Claims, 2 Drawing Sheets

US 7,589,946 B2

LOCAL ACCESS PORT COMMUNICATIONS USING NEAR FIELD INDUCTION

BACKGROUND

Telecommunications network equipment is installed at diverse locations and in a variety of environments around the world. This network equipment, including front access panels, typically includes a local access port. The local access port allows service personnel to communicate with electronics inside the panel using a diagnostic computer, e.g., a notebook computer. The diagnostic computer allows the service personnel to configure, monitor, or troubleshoot the network equipment contained within the panel.

There are risks involved in connecting the diagnostic computer to the panel. The network equipment inside the panel is extremely sensitive to electrostatic discharge (ESD). ESD can severely damage the equipment inside the panel. Extreme caution must be taken when connecting the diagnostic computer to a panel that is currently operating because the local access port is directly connected to sensitive electronics inside the panel. The safest means of attaching the diagnostic computer is to power off the network equipment. Any potential loss of service creates continuity of service issues for customers. Unless the telecommunications network is already powered down due to a service issue, additional safeguards are included in order to monitor network operations in real time.

Traditionally, the additional safeguards used to eliminate the effects of ESD focus on path isolation. Specific electrical paths are included in a circuit design to route potential ESD away from the sensitive electronics. Path isolation techniques add complexity to the overall electrical design, and do not guarantee full immunity in all situations.

SUMMARY

Embodiments of the present invention address problems with accessing electronics in telecommunications network equipment and will be understood by reading and studying the following specification. Particularly, in one embodiment, a method for accessing electronic equipment using near field induction is provided. The method involves attaching at least one local access port connector with an external transformer core partition to a near field induction port on an external non-conductive surface of a panel of the enclosure and generating at least one inductive field between the external transformer core partition and an internal transformer core partition. Without a direct electrical connection, the method provides for communicating with the electronic circuit through the at least one local access port connector of the panel using the at least one inductive field.

DRAWINGS

Figure 1:
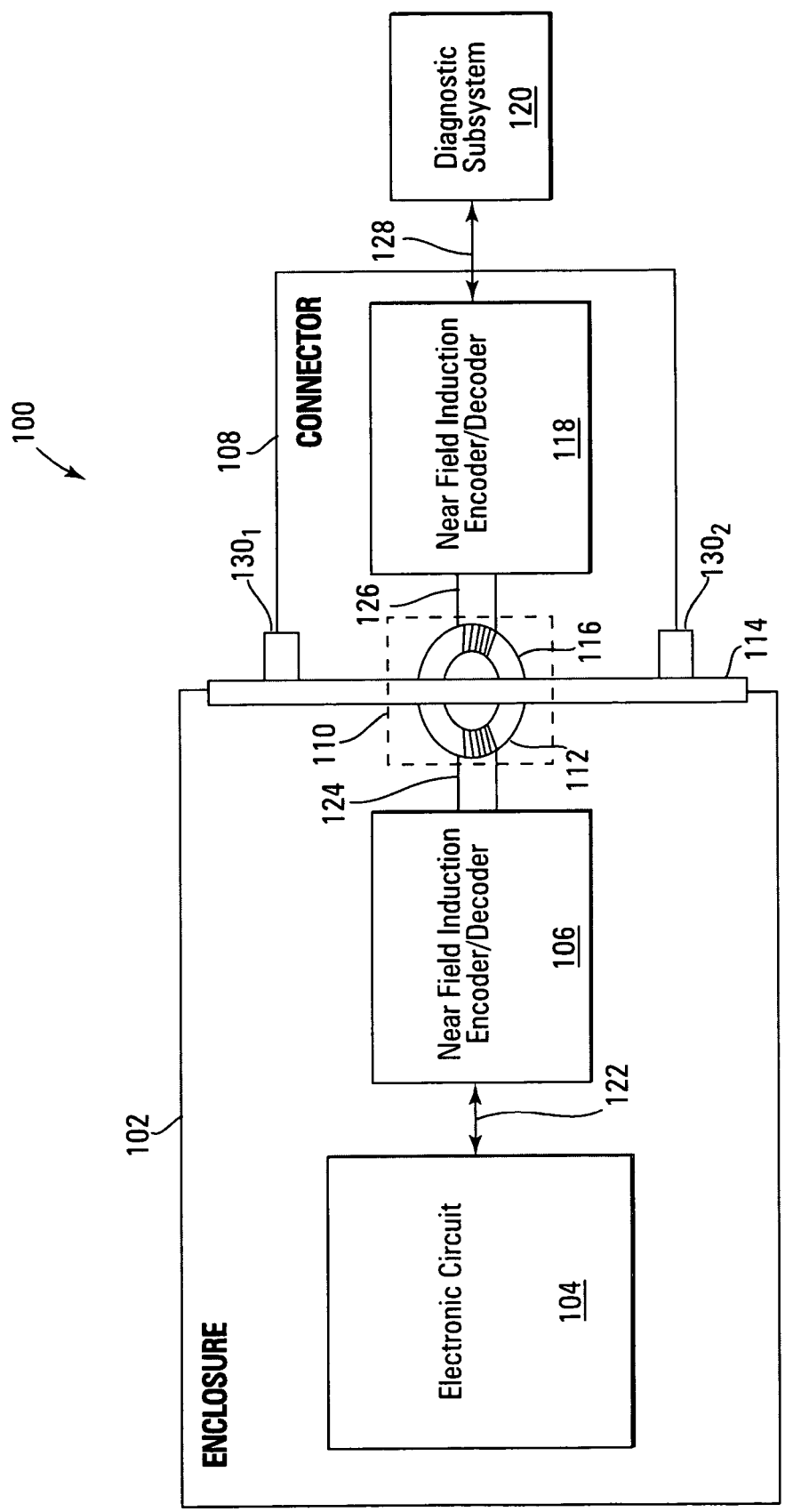
Figure 2:
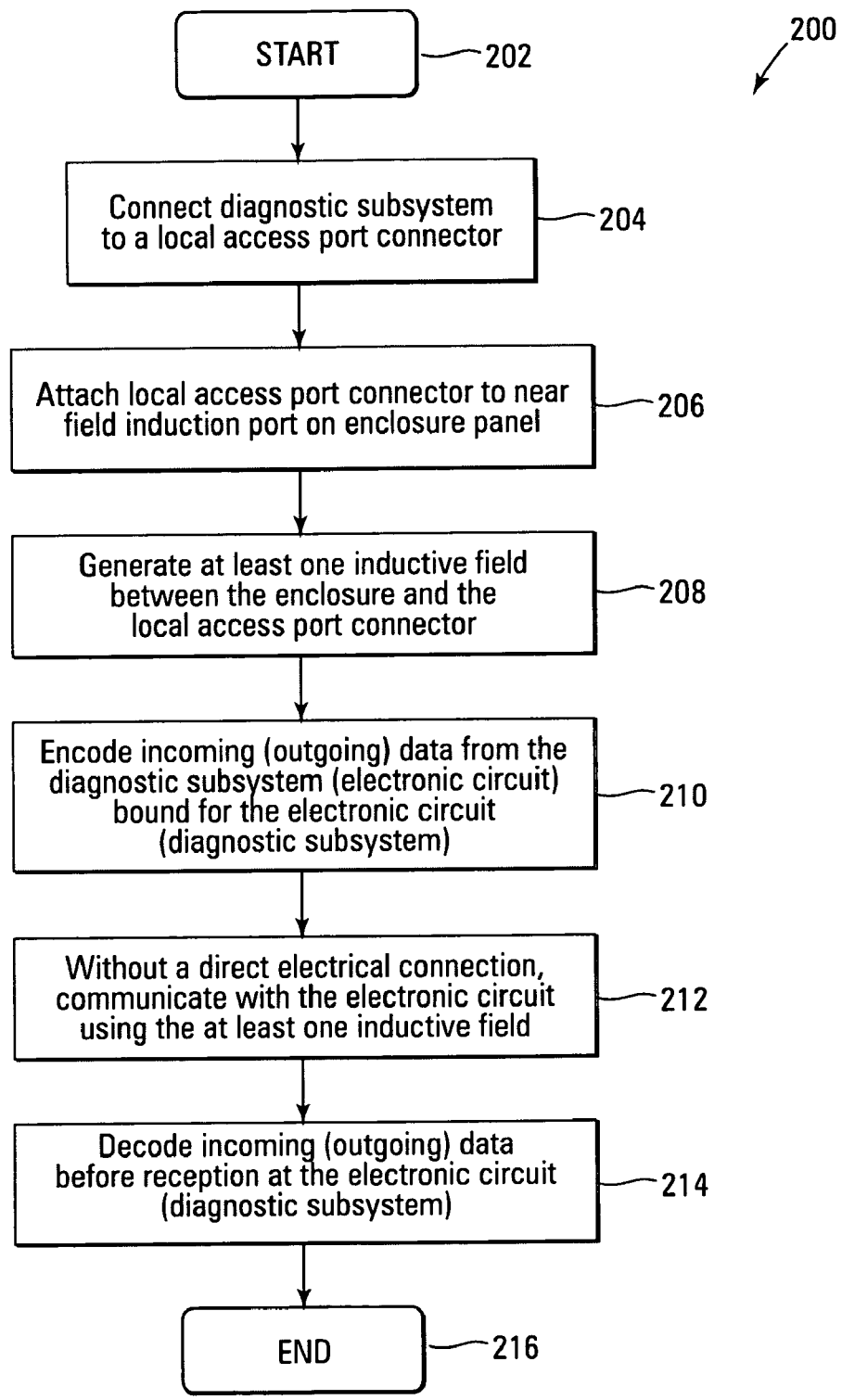

FIG. 1 is a block diagram of an embodiment of a system for local access port communications using near field induction in accordance with the present invention; and FIG. 2 is a flow diagram illustrating an embodiment of a method for local access port communications using near field induction in accordance with the present invention.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical, and electrical changes may be made without departing from the spirit and scope of the present invention. The following detailed description is, therefore, not to be taken in a limiting sense.

Embodiments of the present invention address problems with telecommunications network equipment and will be understood by reading and studying the following specification. Particularly, in one embodiment, a method for accessing electronic equipment using near field induction is provided. The method involves attaching at least one local access port connector with an external transformer core partition to a near field induction port on an external non-conductive surface of a panel of the enclosure and generating at least one inductive field between the external transformer core partition and an internal transformer core partition. Without a direct electrical connection, the method provides for communicating with the electronic circuit through the at least one local access port connector of the panel using the at least one inductive field.

Although the examples of embodiments in this specification are described in terms of telecommunications network equipment, embodiments of the present invention are not limited to telecommunications network equipment. Embodiments of the present invention are applicable to any electronics diagnostic activity that requires access to electronic equipment in an enclosed environment. Alternate embodiments of the present invention utilize methods of near field induction to eliminate direct electrical connections when communicating with sensitive electronic equipment in environments susceptible to ESD.

FIG. 1 is a block diagram of an embodiment of a system, indicated generally at 100, for local access port communications using near field induction according to the teachings of the present invention. System 100 comprises enclosure 102, diagnostic subsystem 120, and local access port connector 108 communicatively coupled to near field induction port 110. Enclosure 102, e.g., a telecommunications equipment cabinet, includes electronic circuit 104 and internal near field inductor encoder/decoder 106 communicatively coupled to near field induction port 110. Near field induction port 110 passes through a non-conductive surface on panel 114. It is noted that for simplicity in description, a single electronic circuit 104, a single internal near field inductor encoder/decoder 106, a single near field induction port 110 and a single local access port connector 108 are shown in FIG. 1. However, it is understood that enclosure 102 houses any appropriate number of electronic circuits 104, internal near field inductor encoder/decoders 106, near field induction ports 110 and local access port connectors 108, e.g., one or more electronics circuits, internal near field inductor encoder/decoders, near field induction ports, and local access port connectors in a single enclosure 102.

In one embodiment, diagnostic subsystem 120 is a personal computer with at least one communications port adapted to connect to the at least one local access port connector 108 along diagnostic communications interface 128. Moreover, diagnostic communications interface 128 is a universal serial bus (USB) interface, an RS-232 interface, a parallel port interface, and the like. Panel 114 is adapted to receive local access port connector 108 with local access port attachments 130$_1$ and 130$_2$. In the example embodiment shown, each of local access port attachments 130$_1$ and 130$_2$ is one of a set of plastic clips, a magnetic connection, or the like. Local access port connector 108 includes external near field induction encoder/decoder 118. External near field induction encoder/decoder 118 is communicatively coupled to near field induction port 110 by external induction interface 126. External induction interface 126 is a direct communications interface between external near field induction encoder/decoder 118 and external transformer core partition 116.

External transformer core partition 116 and internal transformer core partition 112 serve as a single functioning transformer core to form near field induction port 110. Unlikely ordinary communication ports that require a wired connection, near field induction port 110 transfers data between external transformer core partition 116 and internal transformer core partition 112 through panel 114 without a direct electrical connection. Providing an electrical signal to generate a localized magnetic field, then regenerating the electrical signal from the localized magnetic field is referred to as near field induction. In the example embodiment shown, external transformer core partition 116 and internal transformer core partition 112 are equally split between two sides of panel 114. Panel 114 is comprised of non-conductive plastic, a metal, and the like. When panel 114 is comprised of a metal, at least one end of panel 114 is disconnected from enclosure 102 to provide at least one non-conductive surface on enclosure 102 and prevent an electrical short across near field induction port 110.

Panel 114 is designed to eliminate electrostatic discharge (ESD) from damaging sensitive electronics within enclosure 102. Advantageously, any electrical paths that ESD energy would attempt to follow from panel 114 and into electronic circuit 104 are eliminated. In one embodiment, electronic circuit 104, e.g., a network communications processor, includes at least one microprocessor, field-programmable gate array (FPGA), specially-designed application-specific integrated circuit (ASIC), and the like. Electronic circuit 104 is communicatively coupled to internal near field induction encoder/decoder 106 by internal communications interface 122. Internal communications interface 122 is a bidirectional communications link between electronic circuit 104 and internal near field induction encoder/decoder 106. Internal near field induction encoder/decoder 106 is communicatively coupled to internal transformer core partition 112 by internal induction interface 124. Internal induction interface 124 is a direct communications interface between internal near field induction encoder/decoder 106 and internal transformer core partition 112.

In operation, near field induction port 110 generates at least one inductive field. The at least one inductive field provides diagnostic subsystem 120 access to electronics circuit 104 using near field induction. The at least one inductive field generated by near field induction port 110 remains localized around panel 114. Outgoing communication data from electronics circuit 104 is transferred over a high-level communications protocol such as USB, RS-232, high-speed parallel, and the like to diagnostic subsystem 120 for processing. Outgoing communication data from electronics circuit 104 is encoded in internal near field induction encoder/decoder 106. Internal near field induction encoder/decoder 106 transfers the outgoing communication data through panel 114 as near field induction port 110 senses the at least one inductive field. The outgoing communication data is passed onto external near field induction encoder/decoder 118. External near field induction encoder/decoder 118 decodes the outgoing communication data before the outgoing communication data is received by diagnostic subsystem 120.

Similarly, incoming communication data from diagnosis subsystem 120 to be transferred to the electronics circuit 104 is encoded in external near field induction encoder/decoder 118. External near field induction encoder/decoder 118 transfers the incoming communication data through panel 114 as near field induction port 110 senses the at least one inductive field. The incoming communication data is passed onto internal near field induction encoder/decoder 106. Internal near field induction encoder/decoder 106 decodes the incoming communication data before the incoming communication data is received by electronics circuit 104. Diagnosis of electronic circuit 104 with near field induction port 110 eliminates any direct electrical connections between electronics circuit 104 and diagnostic subsystem 120, allowing panel 114 to be constructed without exposed external communication port connections. Additional ESD protection for electronics circuit 104 is no longer required.

FIG. 2 is a flow diagram illustrating an embodiment of a method according to the teachings of the present invention in local access port communications using near field induction. The method of FIG. 2 begins at step 202. A primary function of method 200 is to generate at least one inductive field to transfer data between electronic circuit 104 and diagnostic subsystem 120 without a direct electrical connection.

In an example embodiment, diagnostic subsystem 120 is connected to local access port connector 108 at step 204. At step 206, local access port connector 108 is attached to near field induction port 110 on panel 114. At step 208, the method generates at least one inductive field between enclosure 102 and local access port connector 108. In this example embodiment, the at least one inductive field is contained within near field induction port 110. As discussed earlier with respect to FIG. 1, external transformer core partition 116 of local access port connector 108 and corresponding internal transformer core partition 112 of enclosure 102 form a single functioning transformer core to serve as near field induction port 110. Incoming (outgoing) data from diagnostic subsystem 120 (electronic circuit 104) bound for electronic circuit 104 (diagnostic subsystem 120) is encoded at step 210. Without a direct electrical connection, the method communicates with electronic circuit 104 at step 212 using the at least one inductive field of near field induction port 110. At step 214, incoming (outgoing) data is decoded before reception at electronic circuit 104 (diagnostic subsystem 120). The method concludes at step 216.

The description of the present invention has been presented for purposes of illustration and description, and is not intended to be exhaustive or limited to the invention in the form disclosed. Variations and modifications may occur, which fall within the scope of the present invention, as set forth in the following claims.

What is claimed is:

1. An electronics enclosure, comprising:
at least one panel with a non-conductive surface;
at least one electronic circuit;
at least one internal near field induction encoder/decoder coupled to the at least one electronic circuit;
at least one internal transformer core partition placed on an internal side of the at least one panel, the at least one internal transformer core forming part of a near field induction port; and
wherein the at least one internal transformer core partition is adapted to communicate with an external transformer core partition, when present, to form the near field induction port for data transfer between the at least one electronic circuit and an external device.

2. The electronics enclosure of claim 1, wherein the at least one panel is one of a plastic and a metal.

3. The electronics enclosure of claim 2, wherein at least one end of the at least one metal panel is disconnected from the electronics enclosure to prevent an electrical short across the near field induction port.

4. The electronics enclosure of claim 1, wherein the at least one panel is adapted to receive at least one local access port connector by one of a plastic clip or a magnet.

5. The electronics enclosure of claim 1, wherein the at least one electronic circuit further comprises one of a microprocessor, a field-programmable gate array, and an application-specific integrated circuit.

6. A method for accessing an electronic circuit in an enclosure using near field induction, the method comprising:
    attaching at least one local access port connector with an external transformer core partition to a near field induction port on an external non-conductive surface of a panel of the enclosure;
    generating at least one inductive field between the external transformer core partition and an internal transformer core partition; and
    without a direct electrical connection, communicating with the electronic circuit through the at least one local access port connector of the panel using the at least one inductive field.

7. The method of claim 6, wherein generating the at least one inductive field between the external transformer core partition and the internal transformer core partition further comprises generating data to communicate with the electronic circuit.

8. The method of claim 7, wherein generating data to communicate with the electronic circuit comprises generating data with a diagnostic subsystem coupled to the at least one local access port connector.

9. The method of claim 6, wherein communicating with the electronic circuit further comprises:
    decoding incoming data from the internal transformer core partition before transferring the incoming data to the electronic circuit;
    encoding outgoing data from the electronic circuit before transferring the outgoing data to the internal transformer core partition;
    decoding the outgoing data after receiving the outgoing data at the external transformer core partition; and
    encoding incoming data before transferring the incoming data to the internal transformer core partition.

10. A telecommunications equipment cabinet, comprising:
    at least one panel with a non-conductive surface;
    at least one network communications processor, adapted to send and receive data from at least one internal near field induction encoder/decoder;
    at least one internal transformer core partition placed on an internal side of the at least one panel, the at least one internal transformer core forming part of a near field induction port; and
    wherein the at least one internal transformer core partition is adapted to communicate with an external transformer core partition, when present, to form the near field induction port for data transfer between the at least one network communications processor and an external telecommunications device.

11. The telecommunications equipment cabinet of claim 10, wherein the at least one panel is one of a plastic and a metal.

12. The telecommunications equipment cabinet of claim 11, wherein at least one end of the at least one metal panel is disconnected from the telecommunications equipment cabinet to prevent an electrical short across the near field induction port.

13. The telecommunications equipment cabinet of claim 10, wherein the at least one panel is adapted to receive at least one local access port connector by one of a plastic clip or a magnet.

14. The telecommunications equipment cabinet of claim 10, wherein the at least one network communications processor is one of a microprocessor, a field-programmable gate array, and an application-specific integrated circuit.

15. An apparatus for diagnosing one or more electronic components in an enclosure, the apparatus comprising:
    means for processing data from the one or more electronic components in the enclosure;
    means, coupled to the means for processing, for encoding and decoding the data; and
    means, coupled to the means for encoding and decoding, for inductively coupling data into and out of the one or more electronic components in the enclosure, wherein the means for inductively coupling data is internal to the enclosure, whereby the means for processing data in the enclosure is configured to be communicatively coupled via the internal means for inductively coupling data to an external means for inductively coupling data, when the external means for inductively coupling data is positioned near to and outside of the enclosure.

16. The apparatus of claim 15, wherein the means for processing data comprises a diagnosis subsystem including a personal computer with at least one communications port.

17. The apparatus of claim 15, wherein the means for encoding and decoding the data comprises at least one local access port connector attached to an external panel of the enclosure.

18. The apparatus of claim 15, wherein the means for inductively coupling data into and out of the one or more electronic components in the enclosure comprises near field induction between two halves of a single functioning transformer core separated by a non-conductive surface of a panel of the enclosure.

19. An apparatus for housing at least one electronic circuit, the apparatus comprising:
    means for inductively accessing the at least one electronic circuit, wherein the means for inductively accessing is internal to the housing; and
    means, coupled to the means for accessing, for transferring data between the at least one electronic circuit and an external device, wherein the at least one electronic circuit is communicatively coupled via the internal means for inductively accessing to an external means for inductively accessing when the external means for inductively accessing is positioned near to and outside of the enclosure.

20. The apparatus of claim 19, wherein the means for accessing the at least one electronic circuit comprises at least one near field induction port.

21. The apparatus of claim 19, wherein the means for transferring data between the at least one electronic circuit and an external device comprises:
    at least one internal near field induction encoder/decoder; and
    at least one local access port connector.

* * * * *

UNITED STATES PATENT AND TRADEMARK OFFICE
CERTIFICATE OF CORRECTION

PATENT NO.       : 7,589,946 B2                                   Page 1 of 1
APPLICATION NO.  : 11/354500
DATED            : September 15, 2009
INVENTOR(S)      : Randall L. Powers It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 875 days.

Signed and Sealed this

Twenty-first Day of September, 2010

David J. Kappos
*Director of the United States Patent and Trademark Office*